US012451322B2

(12) United States Patent
Breuer et al.

(10) Patent No.: US 12,451,322 B2

(45) Date of Patent: Oct. 21, 2025

(54) METHOD OF FORMING A MULTIPOLE DEVICE, METHOD OF INFLUENCING AN ELECTRON BEAM, AND MULTIPOLE DEVICE

(71) Applicant: ICT Integrated Circuit Testing Gesellschaft für Halbleiterprüftechnik mbH, Heimstetten (DE)

(72) Inventors: John Breuer, Munich (DE); Dominik Patrick Ehberger, Ebersberg (DE); Kathrin Mohler, Olching (DE); Ivo Liska, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 400 days.

(21) Appl. No.: 18/110,284

(22) Filed: Feb. 15, 2023

(65) Prior Publication Data

US 2024/0274396 A1 Aug. 15, 2024

(51) Int. Cl.

| | |
|---|---|
| ***H01J 37/147*** | (2006.01) |
| ***H01J 37/09*** | (2006.01) |
| ***H01J 37/153*** | (2006.01) |
| ***H01J 37/28*** | (2006.01) |

(52) U.S. Cl.

CPC .......... *H01J 37/1472* (2013.01); *H01J 37/09* (2013.01); *H01J 37/153* (2013.01); *H01J 37/28* (2013.01); *H01J 2237/022* (2013.01); *H01J 2237/1516* (2013.01); *H01J 2237/1534* (2013.01); *H01J 2237/24514* (2013.01)

(58) Field of Classification Search

CPC ........ H01J 37/00; H01J 37/02; H01J 37/1472; H01J 37/26; H01J 37/28; H01J 37/09; H01J 37/153; H01J 2237/022; H01J 2237/1516; H01J 2237/1534; H01J 2237/24514; H01J 2237/282; H01J 2237/31732

USPC ................................ 250/396 R, 492.1, 492.3

See application file for complete search history.

(56) References Cited

U.S. PATENT DOCUMENTS

| | | | | |
|---|---|---|---|---|
| 5,356,514 A * | 10/1994 | Kinoshita | C23F 4/00 216/22 |
| 2011/0183517 A1* | 7/2011 | Auth | H01L 21/76892 257/E21.585 |
| 2012/0305798 A1* | 12/2012 | Zonnevylle | H01J 37/3177 250/397 |

* cited by examiner

*Primary Examiner* — Jason L Mccormack

(74) *Attorney, Agent, or Firm* — Kilpatrick Townsend & Stockton LLP

(57) ABSTRACT

A method of forming a multipole device (100) for influencing an electron beam (11) is provided. The method is carried out in an electron beam apparatus (200) that comprises an aperture body (110) having at least one aperture opening (112). The method comprises directing the electron beam (11) onto two or more surface portions of the aperture body (110) on two or more sides of the at least one aperture opening (112) to generate an electron beam-induced deposition pattern (120) configured to act as a multipole in a charged state, particularly configured to act as a quadrupole, a hexapole and/or an octupole. The electron beam-induced deposition pattern (120) can be an electron beam-induced carbon or carbonaceous pattern. Further provided are methods of influencing an electron beam in an electron beam apparatus, particularly with a multipole device as described herein. Further provided is a multipole device for influencing an electron beam in an electron beam apparatus in a predetermined manner.

13 Claims, 5 Drawing Sheets

METHOD OF FORMING A MULTIPOLE DEVICE, METHOD OF INFLUENCING AN ELECTRON BEAM, AND MULTIPOLE DEVICE

TECHNICAL FIELD

Embodiments described herein relate to methods of forming a multipole device for influencing an electron beam in an electron beam apparatus, e.g. for inspection system applications, testing system applications, or defect review or critical dimensioning applications, particularly in an electron scanning microscope. Embodiments described herein further relate to methods of influencing an electron beam with a multipole device in an electron beam apparatus, particularly for compensating or reducing beam aberrations. Further embodiments relate to multipole devices for influencing an electron beam in an electron beam apparatus as well as to electron beam apparatuses comprising a multipole device.

BACKGROUND

Modern semiconductor technology has created a high demand for structuring, inspecting and probing samples in the nanometer or even in the sub-nanometer scale. Micrometer and nanometer-scale process control, inspection or structuring is often carried out using charged particle beams, particularly electron beams, which are generated, shaped, deflected and focused in electron beam apparatuses, such as electron microscopes. For inspection purposes, electron beams offer a superior spatial resolution compared to e.g. photon beams.

Inspection apparatuses using electron beams such as scanning electron microscopes (SEM) have many functions in a plurality of industrial fields, including, but not limited to, inspection of electronic circuits during manufacturing, exposure systems for lithography, detecting systems, defect inspection tools, and testing systems for integrated circuits. In such electron beam apparatuses, fine beam probes with a high current density can be used. For instance, in the case of an SEM, the primary electron beam generates signal particles such as secondary electrons (SE) and/or backscattered electrons (BSE) that can be used to image and analyze a sample.

The rapid inspection and/or imaging of specimens in a compact electron beam apparatus at a high resolution is, however, challenging. Specifically, various scan deflectors, alignment deflectors, beam correctors and/or other beam-optical components may be provided along the optical axis within the vacuum housing of the electron beam apparatus and may consume a considerable amount of space and increase the complexity of the system. However, space in electron beam apparatuses is typically limited.

Electron beam apparatuses typically use multipole devices, e.g. electrostatic or magnetic multipoles, for correcting aberrations of the electron beam. A multipole consists of a plurality of electrodes arranged around the electron beam path in a predetermined arrangement, wherein each electrode can be set on a predetermined potential. In an electrostatic multipole, each electrode of the multipole can typically be connected to a respective output terminal of a voltage supply. The electrostatic field of the multipole device can influence the electron beam in a predetermined manner, e.g. for compensating or reducing beam aberrations, such as astigmatism.

However, the correction fields that can be generated with a multipole are generally limited by the arrangement, number and mechanical dimensions of the electrodes of the multipole. For example, a quadrupole is not suitable for generating a hexapole field or an octupole field, such that a plurality of conventional multipoles may be required to compensate complex beam aberrations. Specifically, one multipole can only generate a limited number of beam correction fields and may not be suitable for correcting arbitrary aberrations of an electron beam. Furthermore, a high-order multipole (such as a 20-pole) that can generate high-order correction fields may be complex and difficult to handle and may not be necessary in every electron beam apparatus.

In view of the above, it would be beneficial to provide a compact multipole device that is easy to handle and can be adapted to the beam aberrations that are actually present in an electron beam apparatus. Specifically, it would be beneficial to provide a multipole device that can be flexibly provided depending on the actual settings or characteristics of an electron beam generated in an electron beam apparatus. Still further, it would be beneficial to provide a simple multipole device which is suitable for correcting aberrations of an electron beam without complex electrical connections or voltage supply terminals.

SUMMARY

In light of the above, a method of forming a multipole device for influencing an electron beam, a method of influencing an electron beam in an electron beam apparatus, a multipole for influencing an electron beam in an electron beam apparatus, and an electron beam apparatus are provided according to the independent claims.

According to a first aspect, a method of forming a multipole device for influencing an electron beam is provided. The method is carried out in an electron beam apparatus, wherein the electron beam apparatus includes an aperture body having at least one aperture opening. The method includes directing the electron beam onto two or more surface portions of the aperture body on two or more sides of the at least one aperture opening for generating an electron beam-induced deposition pattern configured to act as a multipole in a charged state.

In some embodiments, the electron beam-induced deposition pattern may be a carbonaceous or carbon pattern derived from hydrocarbons present in the electron beam apparatus and deposited upon electron beam impingement on the aperture body in a predetermined (and intended) pattern, namely in the pattern of a multipole having a plurality of electrodes.

In some embodiments, the electron beam-induced deposition pattern is configured to act as a quadrupole, a hexapole, an octupole, a higher-order multipole, or as combinations thereof in the charged state.

In some embodiments, the multipole may be configured to influence the electron beam in a predetermined manner in a charged state when the electron beam propagates through the aperture opening, particularly for compensating or reducing one or more beam aberrations of the electron beam.

After the electron beam-induced generation of the deposition pattern, the electron beam may be influenced with the multipole by: directing the electron beam onto the at least one aperture opening such that an outer portion of the electron beam is blocked by the aperture body and charges up the deposition pattern, and an inner portion of the electron beam propagates through the at least one aperture opening and is influenced by the deposition pattern acting as the multipole in the charged state.

According to a second aspect, a method of influencing an electron beam in an electron beam apparatus is provided, wherein the electron beam apparatus comprises an aperture body having at least one aperture opening and a deposition pattern formed on two or more surface portions of the aperture body on two or more sides of the at least one aperture opening, the deposition pattern being configured to act as a multipole in a charged state. The method includes directing the electron beam on the at least one aperture opening such that an outer portion of the electron beam is blocked by the aperture body and charges up the deposition pattern, and an inner portion of the electron beam propagates through the at least one aperture opening and is influenced in a predetermined manner by the deposition pattern acting as the multipole.

According to a third aspect, a multipole device for influencing an electron beam is provided, wherein the multipole device is formed according to any of the methods described herein.

A multipole device for influencing an electron beam according to embodiments described herein may include: an aperture body having at least one aperture opening for the electron beam; and a deposition pattern formed on two or more surface portions of the aperture body on two or more sides of the at least one aperture opening, the deposition pattern being configured to act as a multipole with electrodes that are chargeable by a first portion of the electron beam for influencing a second portion of the electron beam propagating through the at least one aperture opening in a predetermined manner.

In some embodiments, the deposition pattern may be an electron beam-induced deposition pattern that is formed in the same electron beam apparatus in which the deposition pattern is used for influencing the electron beam for inspecting a sample. In particular, the deposition pattern may be formed in-situ in an electron beam apparatus using an electron beam, particularly in an electron beam-induced deposition process, and the deposition pattern can then act as a multipole in the same electron beam apparatus for influencing said electron beam, e.g. during sample inspection.

According to a fourth aspect, an electron beam apparatus is provided. The electron beam apparatus includes an electron beam source for generating an electron beam propagating along an optical axis, an objective lens for focusing the electron beam onto a sample, and a multipole device according to any of the embodiments described herein, wherein the at least one aperture opening of the multipole device is centered with respect to the optical axis. The multipole device may be arranged between the electron beam source and the objective lens.

Embodiments are also directed at apparatuses for carrying out the disclosed methods and include apparatus parts for performing the individual method actions. The methods may be performed by way of hardware components, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Furthermore, features illustrated or described as part of one embodiment can be used on or in conjunction with other embodiments to yield yet a further embodiment. It is intended that the description includes such modifications and variations.

Figure 1:
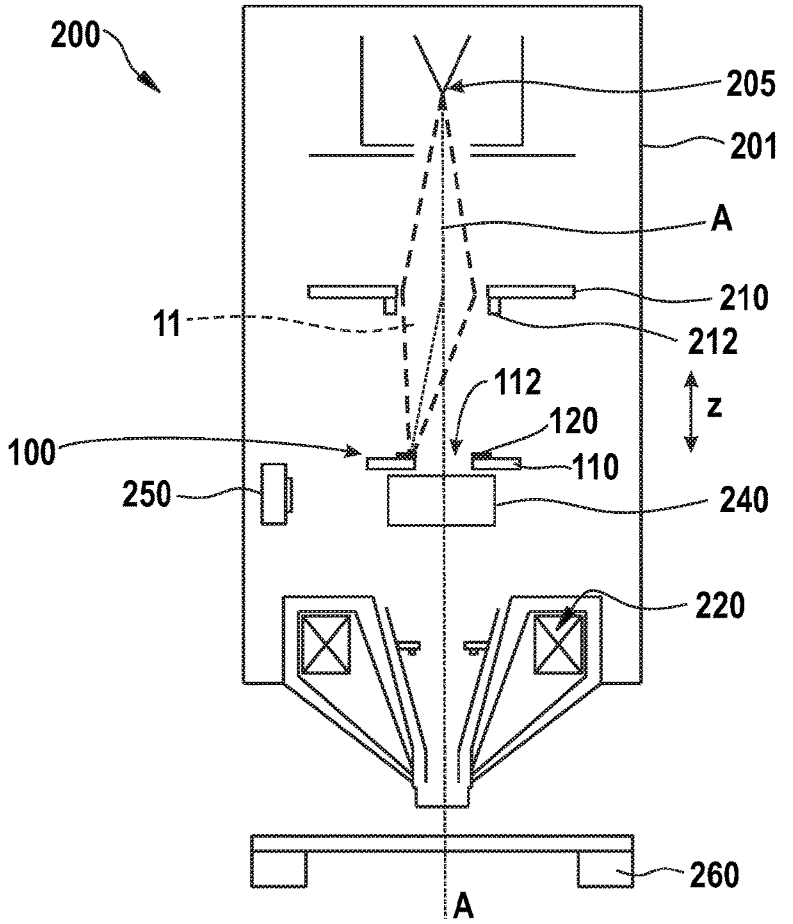
FIG. 1 shows a schematic view of an electron beam apparatus configured to form a multipole according to any of the methods described herein.

FIG. 1 is a schematic view of an electron beam apparatus 200 for forming a multipole device 100 according to any of the methods described herein. The electron beam apparatus 200 includes an electron beam source 205 for generating an electron beam propagating along an optical axis (A) and an aperture body 110 with an aperture opening 112 for the electron beam 11 arranged downstream of the electron beam source 205 inside a vacuum housing 201 of the electron beam apparatus 200. In some embodiments, the aperture opening 112 is centered with respect to the optical axis (A). In other words, the optical axis (A) of the electron beam apparatus may extend through a center of the aperture opening 112. The "optical axis (A)" as used herein is generally defined by the path of the electron beam in an "inspection mode" of the electron beam apparatus, i.e., when a sample is inspected by the electron beam. Hence, the optical axis (A) is not necessarily a straight line and can also be curved or bent, depending on the predetermined path of the electron beam from the source to the sample that is to be inspected. In some implementations, the aperture opening 112 may be arranged and configured such as to act as a beam-limiting aperture for the electron beam, when the electron beam 11 is used for inspecting a sample.

The aperture body may have one single aperture opening, or the aperture body may have a plurality of aperture openings. Specifically, a multi-aperture may be provided by the aperture body having the plurality of aperture openings. "The aperture opening" as used herein may refer to the aperture opening of a single-aperture or may refer to any one or more of the aperture openings of a multiaperture.

The electron beam apparatus 200 may be an electron beam inspection apparatus, e.g. an electron microscope, for inspecting and/or imaging a sample, particularly a scanning electron microscope (SEM). The electron beam apparatus 200 may include a sample stage 260 for placing a sample to be inspected thereon, wherein the sample stage 260 may be movable. For example, the sample stage 260 may be movable in a z-direction (=a direction toward or away from the objective lens 220) and/or in an x-y-plane that is defined by a sample main surface. The electron beam apparatus 200 may include an objective lens 220 for focusing the electron beam on the sample. For example, the objective lens 220 may be a magnetic objective lens, an electrostatic objective lens, or a combined magnetic-electrostatic objective lens.

The electron beam apparatus may include further beam-optical components, such as a beam separator 240 configured to separate signal electrons emitted from the sample from the electron beam 11, a detector 250 configured to detect the signal electrons, and/or a scan deflector for scanning the electron beam over a sample surface.

In some implementations, the electron beam apparatus 200 includes a beam deflector 212 configured to deflect the electron beam 11 relative to the optical axis (A) of the electron beam apparatus and/or a lens 210, e.g., a condenser lens, configured to reduce a beam divergence of the electron beam. The lens 210 may be configured to collimate the electron beam 11 in an "inspection mode" of the electron beam apparatus, and/or the lens 210 and the beam deflector 212 may be configured to direct and/or focus the electron beam 11 on the aperture body 110 in a "multipole formation mode" of the electron beam apparatus.

Figure 6:
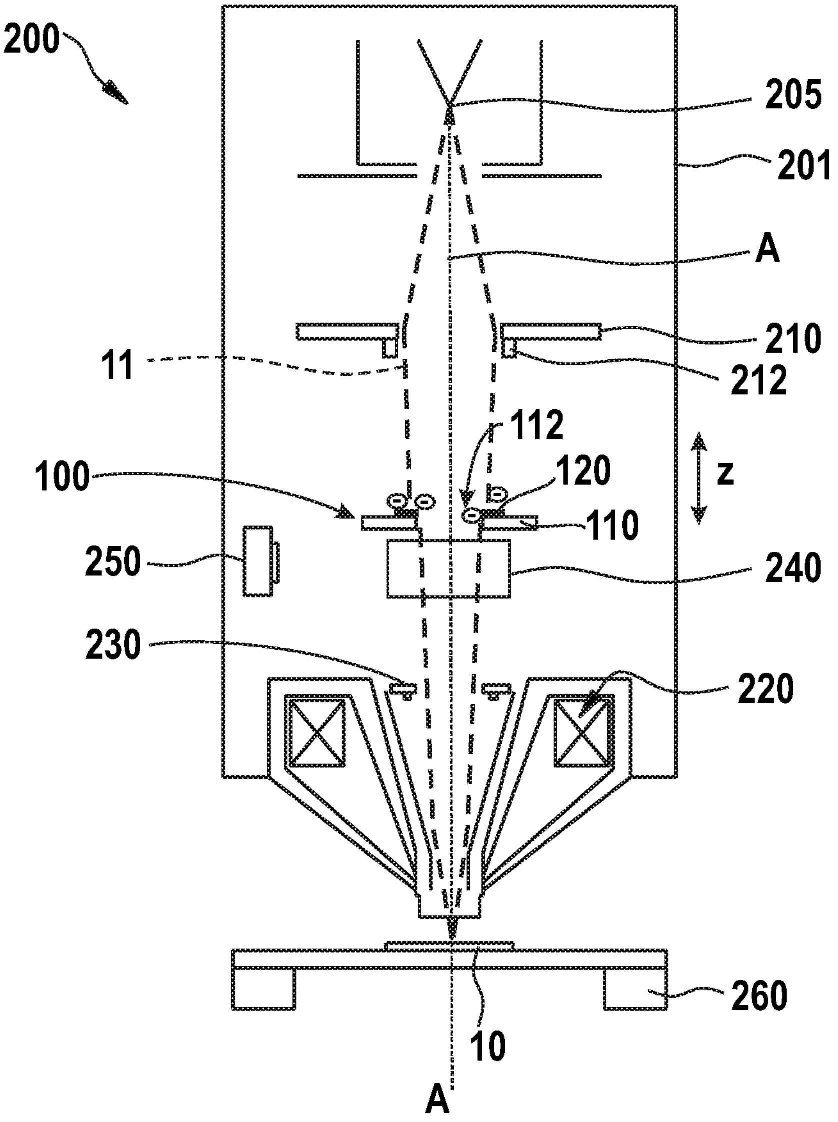
FIG. 6 is a schematic view of an electron beam apparatus in an "inspection mode" during a process of influencing the electron beam according to any of the methods described herein.

A "multipole formation mode" as used herein may refer to settings of the electron beam apparatus 200 suitable for forming and/or for modifying the multipole device 100, particularly for forming and/or modifying electrodes on the aperture body in an electron beam-induced deposition process. The electron beam apparatus 200 in the "multipole formation mode" is schematically depicted in FIG. 1. An "inspection mode" as used herein may refer to settings of the electron beam apparatus 200 adapted to inspect and/or image a sample that is placed on the sample stage 260 with the electron beam. The electron beam apparatus 200 in the "inspection mode" is schematically depicted in FIG. 6. In the "multipole formation mode", a multipole device can be formed, and in the "inspection mode", the multipole device can be used for influencing the electron beam, particularly for compensating or reducing beam aberrations during sample inspection.

Embodiments described herein relate to the formation of a multipole device 100 with the electron beam 11 in the electron beam apparatus 200 in the "multipole formation mode" that is schematically depicted in FIG. 1. The multipole device 100 is formed as follows: the electron beam 11 is directed onto, particularly focused onto, two or more distinct surface portions on two or more sides of the aperture opening 112 for generating an electron beam-induced deposition pattern on said surface portions configured to act as a multipole with two or more electrodes. For example, the electron beam 11 may be directed successively onto two or more, four or more, or eight or more surface portions of the aperture body near the aperture opening by deflecting the electron beam 11 using the beam deflector 212.

Figure 4:
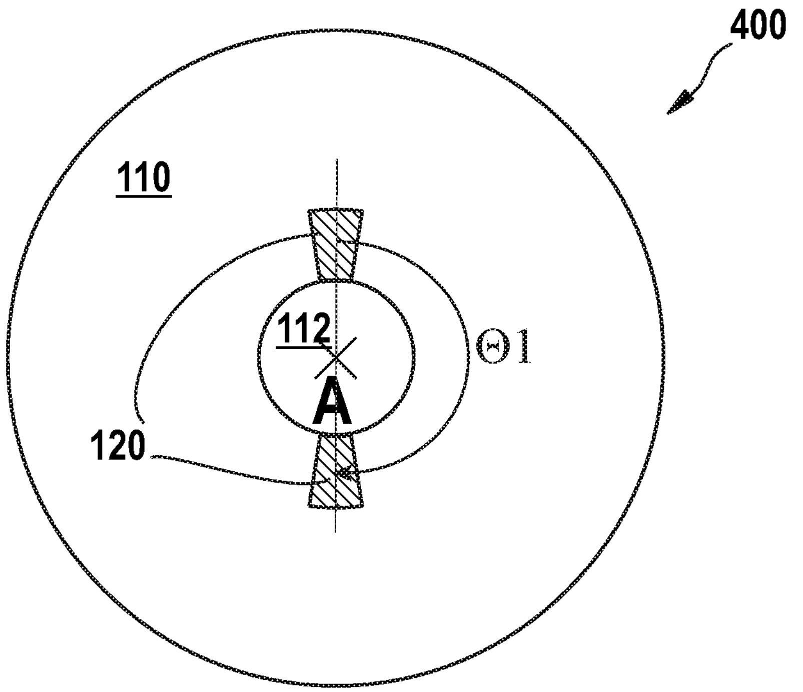
FIG. 4 is a schematic top view of a multipole device for influencing an electron beam according to any of the embodiments described herein.
Figure 5:
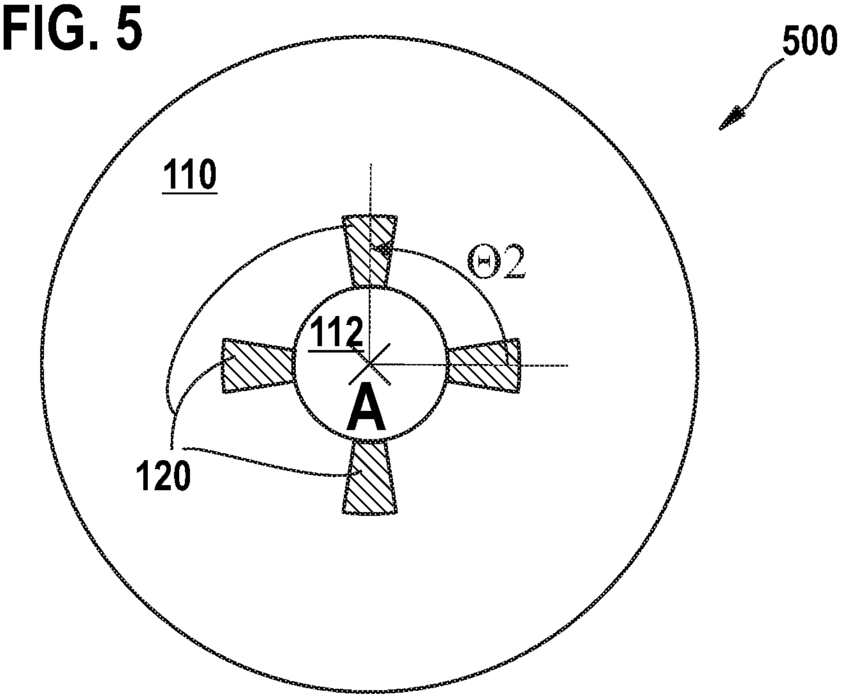
FIG. 5 is a schematic top view of a multipole device for influencing an electron beam according to any of the embodiments described herein.

In particular, the electron beam 11 may be directed onto a first surface portion of the aperture body 110 in order to generate a first electrode portion of the multipole and may then be directed onto a second surface portion of the aperture body on a different side of the aperture opening in order to generate a second electrode portion of the multipole. Optionally, the electron beam may be directed onto still further surface portions of the electrode body on further sides of the aperture opening in order to generate further electrodes of the multipole. For example, a quadrupole, a hexapole, or an octupole can be generated. The electrode portions of the multipole may be distributed around the aperture opening 112 in a circumferential direction, e.g. distributed at even angular intervals (as is schematically depicted in FIGS. 4 and 5) or, alternatively, distributed at irregular angular intervals.

In some implementations, the aperture body 110 is arranged at a position between the electron beam source 205 and the objective lens 220 of the electron beam apparatus 200. The aperture opening 112 may be centered with respect to the optical axis (A) of the electron beam apparatus 200.

Figure 2:
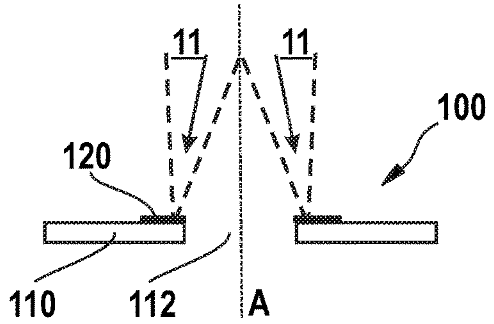
FIG. 2 illustrates a process of forming a multipole on an aperture body according to any of the methods described herein.

Forming the electron beam-induced deposition pattern 120 may include deflecting the electron beam 11 off the optical axis (A) of the electron beam apparatus 200 to impinge successively on the two or more surface portions, as is schematically depicted in FIG. 1 and in FIG. 2. In particular, the electron beam 11 may be successively focused on the two or more surface portions and maintained there for a predetermined time period, respectively. The predetermined time period may, for example, depend on the intended thickness of the respective electrode portion that is to be formed.

FIG. 2 illustrates in further detail a process of forming a multipole device according to any of the methods described herein. The electron beam 11 is directed successively onto the two or more surface portions for generating the electron beam-induced deposition pattern 120 that includes several electrode portions. In particular, one electrode portion of the multipole is generated at each of the surface portions of the aperture body by electron beam illumination for a predetermined time period.

The two or more sides of the aperture opening can be opposite sides of the aperture opening, as is schematically depicted in FIGS. 2 and 4, but are not necessarily opposite sides. A deposition pattern configured to act as a quadrupole can be formed by directing the electron beam onto two surface portions on opposite sides of the aperture opening (e.g. on two surface portions provided at 0° and 180° in a circumferential direction, see FIG. 4). A deposition pattern configured to act as a hexapole can be formed by directing the electron beam onto three surface portions on three different sides of the aperture opening. A deposition pattern configured to act as an octupole can be formed by directing the electron beam onto four surface portions on four different sides of the aperture opening (e.g. on four surface portions at angles of 0°, 90°, 180°, and 270° in a circumferential direction around the aperture opening, see FIG. 5). It is to be noted in this regard that two oppositely arranged electrode portions, if correspondingly charged (such as both negatively charged), generate an electric field that corresponds to a quadrupole field. Similarly, four evenly distributed electrode portions (as in FIG. 5), if correspondingly charged (such as all negatively charged), generate an electric field that corresponds to an octupole field.

The two or more surface portions may be arranged directly adjacent to the aperture opening, such that the electrode portions of the multipole are generated in direct vicinity to the aperture opening 112, as is schematically depicted in FIGS. 1-5. Electrode portions in direct vicinity to the aperture opening enable a charge-up of the electrode portions by the electron beam when the electron beam is centered at the aperture opening in the "inspection mode" of the electron beam apparatus (see FIG. 6).

Embodiments described herein are based on the finding that residual hydrocarbons are typically present in the residual gas in the vacuum housing of electron beam apparatuses, even when the vacuum housing is evacuated. Electron beams can generate carbon contaminations on surfaces inside the vacuum housing by cracking hydrocarbon bonds of the residual gas, whereupon carbon can deposit on surfaces in the electron beam apparatus. Such carbon contaminations are generally undesirable, because carbon contaminations can charge up and can possibly negatively influence the electron beam.

According to embodiments described herein, carbon or carbonaceous contaminations derived from hydrocarbons in electron beam apparatuses are used deliberately for forming a predetermined deposition pattern configured to act as a multipole on the electron beam in the "inspection mode" during sample inspection. In particular, if the electron beam is directed onto or focused onto specific surface portions for a predetermined time period, the electron beam can crack hydrocarbon bonds of preexisting hydrocarbons present in the residual gas, whereupon carbon or carbon-containing components deposit on surfaces in the vicinity of the electron impingement area and form a carbon deposition pattern thereon. The above deposition mechanism can also be referred to as "electron beam induced carbon deposition".

A thickness of the deposited carbon pattern depends on the accumulated charge (i.e., on the beam current density multiplied by the interaction time of the electron beam with the surface portion) and on the ionization energy of the hydrocarbons that are present in the vacuum housing of the electron beam apparatus.

In some embodiments, which can be combined with other embodiments described herein, the electron beam is directed on, particularly focused on, each of the two or more distinct surface portions of the aperture body for a predetermined time that is sufficient for the formation of an electron beam-induced deposition pattern on the respective surface portion with a predetermined thickness. For example, the electron beam may be directed or focused onto each of the two or more distinct surface portions for a time period of 2 minutes or more, particularly 5 minutes or more, or even 10 minutes or more, such that an electron beam-induced carbon layer section is generated on the respective surface portion that can act as an electrode of a multipole.

The electric potential to which the electron beam-deposited electrodes can charge up upon electron impingement depends on the thickness of the deposition pattern. Accordingly, the interaction time of the electron beam with the surface portions for the multipole formation may be set depending on an intended electric potential of the electrodes of the multipole upon charge-up. A beam-influencing strength of the multipole can be adjusted, e.g. depending on a previously measured beam aberration that is to be compensated by the multipole. Alternatively or additionally, the charging of the electrode portions of the multipole can be adapted by adapting the electron energy of the electron beam, i.e., the "beam energy". Even the sign of the charges on the electrode portions (i.e., negative charges or positive charges) can be changed by changing the electron energy of the electron beam, since the secondary electron (SE) yield depends on the energy of the impinging (primary) electrons and, depending on said energy, the amount of SEs leaving the electrode portions may be larger than the amount of electrons applied by the electron beam on the electrode portions.

As mentioned above, it may not be necessary to actively introduce a specific gas, such as a carbon-containing precursor gas, into the electron beam apparatus for the generation of the deposition pattern, because hydrocarbons are also typically present in an evacuated vacuum housing of an electron beam apparatus. For example, hydrocarbons in the residual gas may originate from O-rings, grease, and/or plastic materials that are typically present in electron beam apparatuses. Hydrocarbon contaminations can adsorb to surfaces and diffuse into an irradiated area, e.g. by a random walk process.

Figure 3:
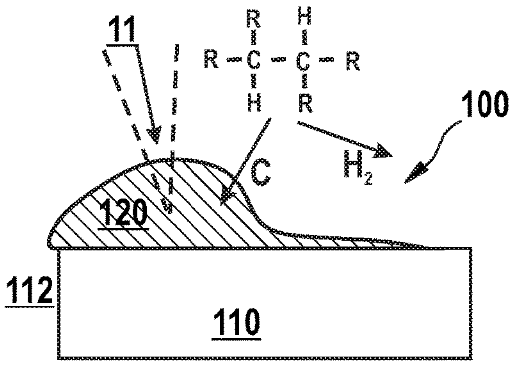
FIG. 3 illustrates a process of forming an electrode of a multipole using an electron beam-induced deposition method according to some of the embodiments described herein.

FIG. 3 illustrates a process of forming an electrode of a multipole according to some of the methods described herein. The electron beam 11 is directed onto a predetermined surface portion of the aperture body 110, such that an electron beam-induced carbon pattern generates on said surface portion. For example, the electron beam 11 may crack bonds of hydrocarbons in the residual gas of the electron beam apparatuses near the surface portion, which may lead to the condensation of carbon on the surface portion. Another electron beam-induced deposition mechanism is based on the migration of hydrocarbons adsorbed on the surface of the aperture body to an impact point where the electron beam hits the surface and cracks the hydrocarbon, leading to the accumulation of carbon on the surface.

The deposition process can be accelerated by increasing the charge density provided by the electron beam on the illuminated surface portion, e.g. by reducing the beam diameter of the electron beam impacting on the surface of the aperture body, particularly by focusing the electron beam onto the surface portion of the aperture body. It may not be necessary for an actual beam focus to be provided on the surface of the aperture body. For example, the electron beam may have a reduced or small beam diameter when hitting the aperture body. The beam diameter of the electron beam on the aperture body can, for example, be controlled by the lens 210. Alternatively or additionally, the beam current of the electron beam can be increased for the formation of the multipole, e.g. by controlling the electron beam source or extractor electrode accordingly. The charge density and/or the beam interaction time may be set depending on an intended thickness of the electron beam-induced deposition pattern on the aperture body.

In some implementations, the electron beam is moved (e.g. via deflector 212) while being directed onto a predetermined surface portion of the aperture body, e.g. for forming an electrode having a predetermined size, circumferential width, radial dimension, or intended special design. In particular, an electrode having a predetermined shape can be "written" on the aperture body by the electron beam. Alternatively or additionally, the electron beam spot size on the aperture body may be controlled depending on the intended size of the respective electrode or depending on the size of a specific feature that is to be written on the aperture body. For example, a narrow electrode can be written on the aperture body by a more strongly focused electron beam, and a broad electrode can be written by a more weakly focused electron beam.

In some embodiments, the deposition process can optionally be accelerated by actively introducing a precursor gas, such as a hydrocarbon-containing precursor gas or another precursor gas, into the electron beam apparatus in the "multipole formation mode". Optionally, a precursor gas comprising a deposition material different from carbon can be introduced in the electron beam apparatus for forming an electron beam-induced deposition pattern comprising another material than carbon, such as silicon or others. Possible precursor gases suitable for electron beam-induced layer deposition on a surface are known to the skilled person from electron beam induced deposition (EBID) systems.

In some embodiments, which can be combined with other embodiments described herein, the electron beam-induced deposition pattern is a carbonaceous or carbon pattern. The carbonaceous or carbon pattern may be derived from hydrocarbons that are present in the electron beam apparatus, particularly in a residual gas without active precursor gas introduction, or optionally with additional hydrocarbon-containing precursor gas introduction.

The electron beam-induced deposition pattern may be formed to comprise a plurality of electrode portions that are distributed in the circumferential direction around the aperture opening. In particular, the deposition pattern may be deposited such that the multipole has a predetermined azimuthal orientation, i.e. a predetermined rotation angle with respect to the optical axis (A). The azimuthal angle of the multipole may be such that a specific non-rotationally symmetric beam aberration of the electron beam (that has optionally been determined previously, e.g. astigmatism, such as 2-fold astigmatism, 3-fold astigmatism and/or 4-fold astigmatism) can be compensated when the multipole is in a charged state.

In some embodiments, the electron beam-induced deposition pattern is generated with an n-fold rotational symmetry with respect to the aperture opening, particularly a 2-fold, 3-fold, 4-fold, 6-fold, 8-fold, or a higher order rotational symmetry, or combinations thereof. For example, the electron beam-induced deposition pattern may be configured to act as a quadrupole, a hexapole, an octupole, a 12-pole, a 16-pole, a higher-order multipole, or as combinations thereof in the charged state. For example, a quadrupole field can be used to compensate or reduce a specific amount of 2-fold astigmatism that may be present in the electron beam apparatus. The electrode portions configured to generate the quadrupole field in the charged state (e.g. two oppositely arranged, negatively charged electrode portions) may be "written" on the aperture body to have a predetermined azimuthal orientation adapted to the orientation of 2-fold astigmatism present in the electron beam apparatus. Similarly, an octupole field can be used to compensate or reduce a specific amount of 4-fold astigmatism. The electrode portions configured to generate the octupole field in the charged state (e.g., four electrode portions distributed at even angular intervals around the aperture opening and being negatively charged, respectively) may be "written" on the aperture body to have a predetermined azimuthal orientation adapted to the orientation of the 4-fold astigmatism present in the electron beam apparatus.

FIG. 4 is a schematic top view of a multipole device 400 for influencing an electron beam according to any of the embodiments described herein. The multipole device 400 may be formed according to any of the methods described herein, i.e. by an electron beam-induced deposition process conducted in the electron beam apparatus. The multipole device 400 includes an aperture body 110 having an aperture opening 112 for the electron beam and a deposition pattern 120 formed on two (or more) specific surface portions of the aperture body on two (or more) sides of the aperture opening, particularly adjacent to the aperture opening 112. The deposition pattern 120 is configured to act as a multipole that is chargeable by an outer portion of the electron beam and that can influence an inner portion of the electron beam propagating through the aperture opening in a predetermined manner.

The multipole device 400 of FIG. 4 is configured to act as a quadrupole (configured to generate a quadrupole field in the charged state) and has two electrode portions that are distributed around and arranged adjacent to the aperture opening 112 in the circumferential direction, particularly evenly distributed in the circumferential direction. Two adjacent electrode portions may respectively enclose an angle $\theta 1$ (here=180°) relative to the optical axis (A).

FIG. 5 is a schematic top view of a multipole device 500 for influencing an electron beam according to any of the embodiments described herein. The multipole device 500 may be formed according to any of the methods described herein. Differently from the deposition pattern of FIG. 4, the deposition pattern 120 of FIG. 5 is configured to act as an octupole (configured to generate an octupole field in the charged state) and has four electrode portions that are distributed around the aperture opening in the circumferential direction, and that are in particular evenly distributed. Two adjacent electrode portions may respectively enclose an angle $\theta 2$ (here=90°) relative to the optical axis (A).

The deposition pattern 120 that is configured to act as the multipole may be a carbonaceous or carbon pattern, particularly a pattern that is formed in an electron beam-induced deposition process as described herein.

In some embodiments, which can be combined with other embodiments described herein, the multipole device does not include any voltage or power supply connections connected to the deposition pattern for charging the multipole. In particular, the electrode portions of the multipole may not be connected to voltage connection lines or to an external voltage or power supply. Rather, the electrode portions of the multipole may be configured to be charged by a first (particularly an outer) part of the electron beam when the electron beam propagates along the optical axis (A) through the aperture opening in the "inspection mode" of the electron beam apparatus.

In some embodiments, the multipole that is provided by the deposition pattern comprises two or more electrode portions configured to generate at least one of a quadrupole field, a hexapole field, an octupole field, or a higher-order multipole field, or combinations thereof. For example, the multipole may have two oppositely arranged electrode portions, or three, four, five or more electrode portions that may be distributed at even angular intervals around the aperture opening. Alternatively, the multipole may be individually formed for influencing the electron beam in a predetermined and specific manner in the "inspection mode" of the electron beam apparatus.

The multipole device 100 described herein can be used for influencing the electron beam 11 in the electron beam apparatus 200 in a predetermined manner, particularly when the electron beam apparatus 200 is provided in an "inspection mode" that is schematically depicted in FIG. 6. "Influencing the electron beam in a predetermined manner" as used herein may refer to the fact that the multipole is designed and formed such as to influence the electron beam in a predetermined and intended way upon charge-up of the multipole in the “inspection mode”, particularly with the aim of reducing beam aberrations.

FIG. 6 is a schematic view of an electron beam apparatus 200 during a process of influencing the electron beam 11 according to some of the embodiments described herein, wherein the multipole device 100 is used for influencing the electron beam 11, particularly in the “inspection mode” of the electron beam apparatus. As is schematically depicted in FIG. 6, the electron beam 11 is directed onto the aperture opening 112 such as to be centered with respect to the optical axis (A). A radially outer portion of the electron beam 11 is blocked by the aperture body 110 and charges up the deposition pattern 120, and a radially inner portion of the electron beam 11 propagates through the aperture opening and is influenced in a predetermined manner by the deposition pattern acting as the multipole. FIG. 6 shows the electron beam apparatus in the “inspection mode”, in which the electron beam 11 is used for inspecting a sample 10 by focusing the electron beam 11 on the sample with the objective lens 220. In the “inspection mode”, the electron beam may propagate along the optical axis through the aperture opening.

The aperture opening 112 may be configured to act as a beam-limiting opening in the “inspection mode” of the electron beam apparatus. A “beam-limiting opening” blocks an outer radial portion of the electron beam and allows a central portion of the electron beam to pass through the beam-limiting opening. The outer radial portion of the electron beam impinges on the edge of the aperture body surrounding the aperture opening, where the deposition pattern is formed, charging up the deposition pattern. The charged deposition pattern can influence the inner portion of the electron beam propagating through the aperture opening in a predetermined manner, acting in particular like a multipole that reduces or removes beam aberrations of the electron beam.

In some embodiments, which can be combined with other embodiments described herein, the aperture opening has a diameter of 500 μm or less, particularly 100 μm or less, more particularly 50 μm or less. An opening diameter of 500 μm or less may be suitable for limiting the width of the electron beam while allowing a major portion of the electron beam to propagate through the aperture opening. A ratio between a first part of the electron beam that is blocked by the aperture body and a second part of the electron beam that propagates through the aperture opening can optionally be set by the lens 210 that may be arranged upstream of the aperture opening.

In the “inspection mode” of the electron beam apparatus 200 that is depicted in FIG. 6, the lens 210 can be controlled to collimate the electron beam, the beam deflector 212 can be set for ensuring a beam propagation along the optical axis (A) toward the objective lens 220, and/or the objective lens 220 may be set to focus the electron beam onto the sample 10 that is to be inspected. Optionally, in the “inspection mode”, the collimation angle of the electron beam set by the lens 210 can be adjusted for adjusting the part of the electron beam that propagates through the aperture opening, i.e. for adjusting the beam current downstream of the aperture body. Optionally, a scan deflector 230 can scan the electron beam 11 over a surface of the sample 10. Signal electrons (particularly secondary electrons SE and/or backscattered electrons BSE) emitted from the sample 10 may be separated from the electron beam 11 by a beam separator 240 and may be detected by the detector 250.

In some embodiments, which can be combined with other embodiments described herein, the aperture body 110 may be made of a conductive material, such as metal, such that the aperture body 110 can be set on a predetermined electric potential, such as a column potential or ground. For example, the aperture body may be connected to a column potential of the electron beam apparatus. The deposition pattern 120 may be an electron beam-induced deposition pattern, particularly a carbon pattern, suitable for being charged up relative to the potential of the aperture body 110 by electrons impinging thereon. A negative charge-up of the deposition pattern is possible (if more electrons from the electron beam remain on the deposition pattern as compared to the SEs leaving the deposition pattern upon beam impingement) and a positive charge-up is possible (if less electrons from the electron beam remain on the deposition pattern as compared to the SEs leaving the deposition pattern upon beam impingement). In a typical embodiment, when electrons of the electron beam 11 impinge on the deposition pattern 120, the deposition pattern 120 charges up negatively, such that the electron beam is affected by the negatively charged deposition pattern. Notably, the effect of a specific deposition pattern—if negatively charged—on an electron beam is generally different from the effect of the same deposition pattern—if positively charged. Hence, if a specific beam aberration is to be corrected with the deposition pattern in the charged state, the azimuthal orientation in which the deposition pattern is “written” on the electrode body may be chosen depending on the sign of the charges to be applied on the deposition pattern in the “inspection mode”.

All electrode portions of the deposition pattern 120 can be charged up negatively by the electron beam in the “inspection mode”. For example, if the deposition pattern 120 is formed with two oppositely arranged electrode portions, the deposition pattern acts in the “inspection mode” as a quadrupole with two negatively charged electrodes and two portions that have a more positive electric potential, in an alternate arrangement in the circumferential direction. If such a quadrupole has an appropriate azimuthal orientation (and strength), a predetermined amount of astigmatism of the electron beam can be reduced (or even completely removed, if the quadrupole has an appropriate strength, i.e. the electrodes are set on an appropriate potential). In some embodiments, the multipole is “written” on the aperture body depending on a previously determined beam aberration of the electron beam. In particular, any one or more of (i) a number of electrodes, (ii) a size of the electrodes, (iii) a shape of the electrodes, (iv) an arrangement of the electrodes, (iv) an azimuthal angle of the multipole, and (v) a thickness of the electrodes is/are “written” on the aperture body depending on the previously determined beam aberration.

Methods of forming a multipole device as described herein can be flexibly used “in-situ” (i.e. in the same electron beam apparatus that is then used also for sample inspection, utilizing the multipole for beam correction) to generate a multipole having an azimuthal orientation adapted to compensate aberrations that are present in the system. Specifically, the aberrations of an electron beam can first be determined, for example in the “inspection mode”, and the multipole device can then be formed in-situ on the aperture body in the “multipole formation mode” based on the determined beam aberrations, such that the previously determined beam aberrations are compensated or at least reduced in the “inspection mode” of the electron beam apparatus.

In particular, according to some embodiments, the method of forming the multipole device may include a determination of a beam aberration of the electron beam in the electron beam apparatus before the generation of the electron beam-induced deposition pattern. The electron beam-induced deposition pattern can then be generated on the aperture body in a geometry and/or thickness adapted to least partially compensate or reduce said beam aberration when the electron beam is centered on and (partially) propagates through the aperture opening.

In some implementations, which can be combined with other embodiments, the deposition pattern acting as the multipole is not supplied with an external voltage or power for influencing the electron beam in the "inspection mode". Rather, the deposition pattern can be charged only by (a part of) the electron beam impinging thereon. Voltage or current connection lines and/or voltage or current sources, which may be complex and difficult to handle and manufacture in case of a high-order multipole, may not be necessary in the embodiments described herein.

In some embodiments, which can be combined with other embodiments described herein, the method may further comprise modifying and/or rewriting the electron beam-induced deposition pattern, for example for adapting the multipole to a different setting of the electron beam apparatus with different characteristics of the electron beam. In particular, the multipole can be modified and/or rewritten in-situ in the same electron beam apparatus in which the multipole is used for influencing the electron beam during sample inspection. For example, if beam aberrations are determined during use of the electron beam apparatus, the multipole can be modified or a new multipole can be deposited on the aperture body, depending on the determined beam aberrations, particularly for reducing or removing said beam aberrations.

In an example, a high-order aberration of the electron beam may be determined during operation of the electron beam apparatus. The multipole can be adapted or modified using the electron beam-induced deposition process described herein for reducing or removing said high-order aberration. In a second example, a quadrupole can be modified to become an octupole (or a 12-pole) by depositing further electrode portions on the aperture body in an electron beam-induced deposition process. In a third example, the thickness and/or the size of some or all electrodes of the multipole can be increased or reduced, if it is determined that the multipole is too weak or too strong. In a fourth example, a specific individual electrode pattern can be "written" on the aperture body for reducing or removing a specific beam aberration or for generating an electron beam having a specific beam profile.

In some embodiments, which can be combined with other embodiments described herein, any of the methods described herein may further include at least partially removing the electron beam-induced deposition pattern from the aperture body in the electron beam apparatus, and directing the electron beam onto the aperture body for generating a second beam-induced deposition pattern configured to act as a second multipole. The second electron beam-induced deposition pattern can be formed according to any of the methods described herein, wherein reference is made to the above explanations which are not repeated here. Depositing a substantially uniform contamination pattern on the aperture body in the vicinity of the aperture opening may have a similar effect as a (partial or complete) removal of the deposition pattern, because a substantially uniform contamination pattern generally charges up uniformly since no distinct electrode portions are present.

A previously deposited deposition pattern can be partially or entirely removed, for example, by heating the aperture body to a temperature suitable for pattern reduction or pattern removal, e.g. to a temperature of 200° C. or more, particularly 400° C. or more, if a carbon pattern is to be removed. Alternatively or additionally, a cleaning gas suitable for deposition pattern removal may be introduced into the electron beam apparatus, particularly at least one of ozone, oxygen radicals, and a reducing gas. Alternatively or additionally, the aperture body may be cleaned, e.g. by plasma cleaning. Alternatively or additionally, the aperture body may be cooled, e.g. to a temperature below −50° C., such as −80° C. or less, for example, to a temperature between −80° C. and −150° C. (adsorbed molecules can lead to an etching effect). In particular, a previously deposited deposition pattern can be removed chemically, thermally and/or possibly by writing a homogeneously thick contamination over the existing multipole.

Figure 7:
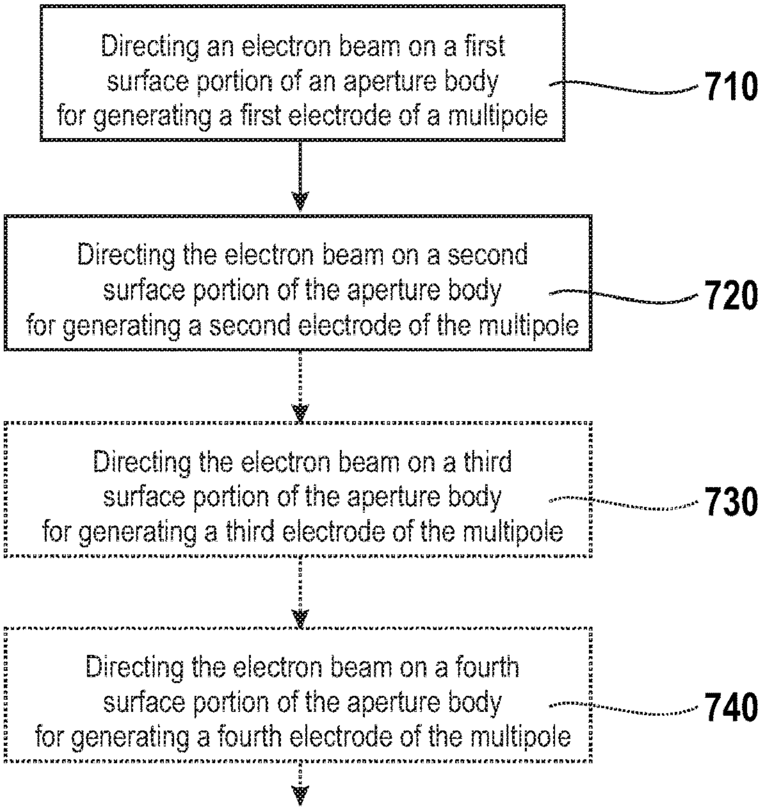
FIG. 7 is a flow diagram illustrating a method of forming a multipole device according to embodiments described herein.

FIG. 7 is a flow diagram illustrating a method of forming a multipole device according to embodiments described herein. In box 710, the electron beam is directed onto a first distinct surface portion of an aperture body for forming a first electrode of a multipole on the aperture body adjacent to the aperture opening in an electron beam-induced deposition process. The first electrode may include or consist of carbon, particularly derived from hydrocarbon contaminations present in the electron beam apparatus. In box 720, the electron beam is directed onto a second surface portion of the aperture body different from the first surface portion to form a second electrode of the multipole on the aperture body adjacent to the aperture opening in the electron beam-induced deposition process. Further electrodes may be formed accordingly, as is illustrated by boxes 730 and 740. For example, a quadrupole may be formed that includes electrode portions made of or including carbon.

Figure 8:
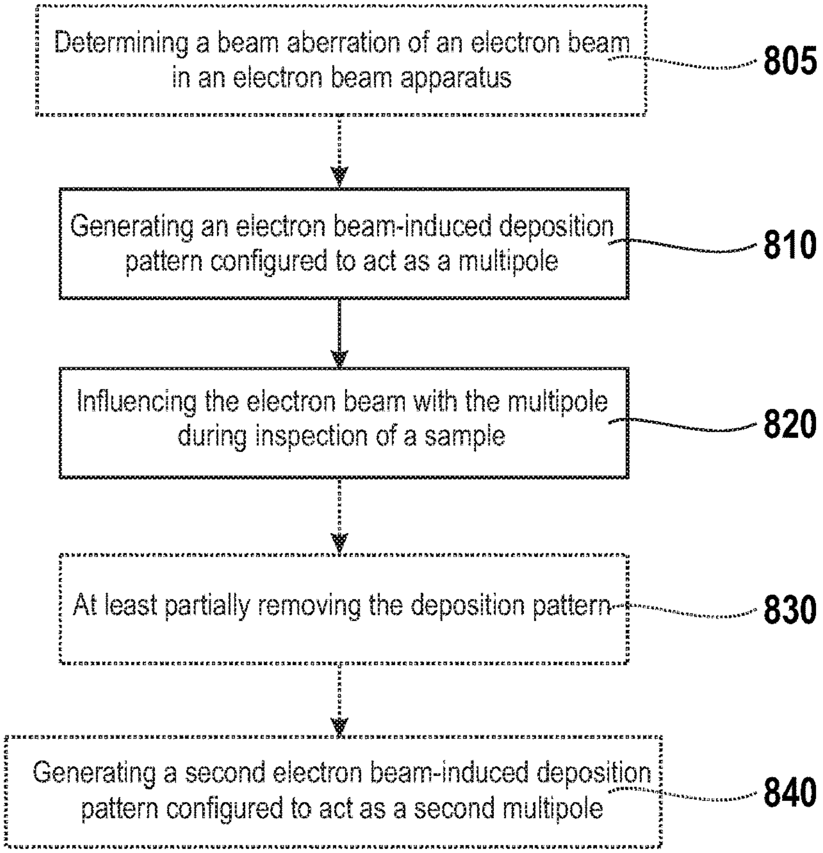
FIG. 8 is a flow diagram illustrating a method of influencing an electron beam according to embodiments described herein.

FIG. 8 is a flow diagram illustrating a method of influencing an electron beam according to embodiments described herein. Optionally, as illustrated by box 805, a beam aberration of an electron beam (such as astigmatism, spherical aberration, coma, chromatic aberration(s), and/or others) in an electron beam apparatus may be determined. An electron beam-induced deposition pattern configured to act as a multipole is generated on an aperture body that is arranged in a vacuum housing of the electron beam apparatus, as is illustrated by box 810. The deposition pattern may be formed according to any of the methods described herein, particularly in an electron beam-induced carbon deposition process. The deposition pattern may be formed based on the previously determined beam aberration. In box 820, the electron beam is influenced by the multipole during the inspection of a sample, particularly for reducing or removing the beam aberration. The multipole may optionally be charged only by the electron beam, not by an external voltage or power supply. Optionally, as is illustrated by boxes 830 and 840, the multipole can be flexibly rewritten or modified in-situ in the electron beam apparatus, and optionally a second electron beam-induced deposition pattern can be written on the aperture body. A partial or complete removal of the deposition pattern is optionally possible (see box 840), e.g. before the writing of a different second deposition pattern.

Figure 9:
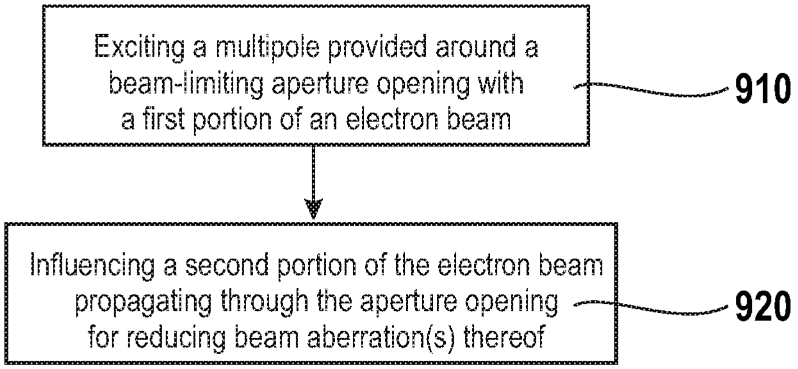
FIG. 9 is a flow diagram illustrating a method of influencing an electron beam according to embodiments described herein.

FIG. 9 is a flow diagram illustrating a method of influencing an electron beam according to embodiments described herein. In box 910, a multipole that is provided around a beam-limiting aperture opening formed in an aperture body is negatively charged (or alternatively positively charged, depending on the electron beam energy) with a first (e.g. outer) portion of an electron beam. The multipole may be deposited according to any of the methods described herein. The charged multipole can influence a second (e.g. inner) portion of the electron beam propagating through the beam-limiting aperture opening, as is illustrated by box 920. For example, one or more beam aberration(s) of the electron beam may be reduced and/or a predetermined beam profile may be generated.

According to the embodiments described herein, an electron beam can be used to write a “contamination pattern” on an aperture body configured to act as a multipole for influencing the electron beam. The “contamination pattern” can charge up during electron beam illumination and create a multipole field which can be used to correct aberrations or otherwise influence the electron beam in an intended way. A controlled formation of a “contamination pattern” and the subsequent charging can be used to create customized multipole elements. A geometry of the deposited multipole corresponds to the geometry of the electron beam-induced “contamination pattern”. The multipole can be excited by an electron beam-induced charging of the contamination pattern. The electron beam-induced deposition pattern can be rewritten (if it is not stable over an extended time period) or modified using the electron beam, and therefore the geometry of the multipole can be changed in-situ in order to obtain a predetermined multipole field.

Specifically, the following embodiments are described herein:

Embodiment 1: A method of forming a multipole device (100) for influencing an electron beam (11), the method carried out in an electron beam apparatus (200) that comprises an aperture body (110) having an aperture opening (112), the method comprising: directing the electron beam (11) onto two or more surface portions of the aperture body on two or more sides of the aperture opening (112) to generate an electron beam-induced deposition pattern (120) configured to act as a multipole in a charged state.

The multipole may be configured for influencing the electron beam (11) in a predetermined manner, when the electron beam (11) propagates (at least partially) through the aperture opening (112), particularly to compensate or reduce a beam aberration of the electron beam.

In some embodiments, the electron beam apparatus may be an electron beam inspection apparatus configured for imaging and/or inspecting a specimen. In particular, the electron beam apparatus may be an electron microscope, particularly a scanning electron microscope (SEM).

Embodiment 2: The method of claim 1, wherein the electron beam-induced deposition pattern (120) is a carbonaceous or carbon pattern derived upon electron beam impingement from hydrocarbons present in the electron beam apparatus. In particular, the deposition pattern (120) may be derived from residual hydrocarbons that are present in a residual gas in a vacuum chamber of the electron beam apparatus, i.e. without actively introducing a precursor gas into the electron beam apparatus.

Alternatively, a precursor gas, such as for example a hydrocarbon-containing precursor gas, may be introduced into the electron beam apparatus in order to accelerate the electron beam-induced deposition process.

Embodiment 3: The method of embodiment 1 or 2, wherein the aperture opening (112) is configured to act as a beam-limiting opening for the electron beam when the electron beam is used for inspecting a sample (10) (i.e. in an “inspection mode” of the electron beam apparatus). In particular, an outer portion of the electron beam may be blocked by an edge of the aperture body (110) surrounding the aperture opening. In some embodiments, which can be combined with other embodiments described herein, the aperture opening (112) may have a diameter of 500 μm or less, particularly 100 μm or less, more particularly 50 μm or less, and/or 10 μm or more. In some embodiments, only one aperture opening for the electron beam may be formed in the aperture body, particularly centered with respect to an optical axis (A) of the electron beam apparatus.

Embodiment 4: The method of any of claims 1 to 3, wherein the electron beam-induced deposition pattern is formed to comprise a plurality of electrode portions that are distributed in a circumferential direction around the aperture opening and that provide a multipole having a predetermined azimuthal orientation.

In some embodiments, the deposition pattern may be comprised of a plurality of electrode portions that are spaced apart from each other in the circumferential direction and/or that are arranged directly adjacent to the aperture opening. This allows a charge-up of the plurality of electrode portions by the electron beam, e.g. when the electron beam has a sufficiently large diameter (equal to or larger than the diameter of the aperture opening) and is centered on the aperture opening.

In some embodiments, the deposition pattern may be oriented at a predetermined azimuthal angle with respect to an optical axis (A) of the electron beam apparatus such as to have a predetermined effect on an electron beam propagating through the aperture opening, e.g. for correcting a non-rotationally symmetric beam aberration, such as astigmatism.

Embodiment 5: The method of any of embodiments 1 to 4, wherein the electron beam-induced deposition pattern (120) is generated with an n-fold rotational symmetry with respect to the aperture opening (112), particularly a 2-fold, 3-fold, 4-fold, 6-fold, 8-fold, or a higher order rotational symmetry, or combinations thereof. In particular, the deposition pattern may comprise a plurality of electrode portions distributed around and arranged directly adjacent to the aperture opening at evenly spaced angular intervals.

Embodiment 6: The method of any of embodiments 1 to 5, wherein the electron beam-induced deposition pattern (120) is configured to act as a quadrupole, a hexapole, an octupole, a higher-order multipole, or as combinations thereof, in the charged state.

Embodiment 7: The method of any of embodiments 1 to 6, wherein the aperture body (110) is arranged at a position between an electron beam source (205) and an objective lens (220) of the electron beam apparatus, in particular wherein the aperture opening (112) is centered with respect to an optical axis (A) of the electron beam apparatus.

Embodiment 8: The method of any of embodiments 1 to 7, wherein directing the electron beam onto the two or more surface portions of the aperture body (110) comprises deflecting the electron beam off the optical axis (A) of the electron beam apparatus to impinge successively on the two or more surface portions. In particular, the electron beam may be successively focused onto the two or more surface portions. The electron beam may be directed onto each of the two or more surface portions for a predetermined time interval, e.g. 1 minute or more, 5 minutes or more, or even 10 minutes or more.

Embodiment 9: The method of any of embodiments 1 to 8, further comprising: at least partially removing the electron beam-induced deposition pattern (120) from the aperture body in the electron beam apparatus; and/or directing the electron beam onto the aperture body to generate a second electron beam-induced deposition pattern on the aperture body, said second electron beam-induced deposition pattern being configured to act as a second multipole different from the (first) multipole.

For example, the second multipole may differ from the (first) multipole in the number of electrodes. Alternatively or additionally, the (first) multipole and the second multipole may be oriented at different azimuthal angles, for example rotated relative to each other around the optical axis of the electron beam apparatus.

Embodiment 10: The method of embodiment 9, wherein at least partially removing the beam-induced deposition pattern comprises heating the aperture body (110) to a temperature suitable for deposition pattern removal, e.g. a temperature above 200° C., particularly a temperature above 400° C. Alternatively or additionally, a cleaning gas for deposition pattern removal, particularly at least one of ozone, oxygen radicals and a reducing gas, may be introduced into the electron beam apparatus for deposition pattern removal.

Embodiment 11: The method of any of embodiments 1 to 10, further comprising: determining a beam aberration of the electron beam (11) in the electron beam apparatus, wherein the electron beam-induced deposition pattern (120) is generated in a geometry for at least partially compensating or reducing said beam aberration when the electron beam is centered on and partially propagates through the aperture opening.

Embodiment 12: The method of any of embodiments 1 to 11, further comprising influencing the electron beam (11) with the multipole device by directing the electron beam onto the aperture opening such that an outer portion of the electron beam is blocked by the aperture body (110) and charges up the deposition pattern, and an inner portion of the electron beam propagates through the aperture opening (112) and is influenced by the deposition pattern (120) that acts as the multipole in the charged state.

Embodiment 13: A method of influencing an electron beam with a multipole device (100) formed by the method according to any of embodiments 1 to 11.

Embodiment 14: The method of embodiment 13, comprising directing the electron beam on the aperture opening (112) such that an outer portion of the electron beam is blocked by the aperture body (110) and charges up the deposition pattern, and an inner portion of the electron beam propagates through the aperture opening (112) and is influenced by the deposition pattern that acts as the multipole in the charged state.

Embodiment 15: A method of influencing an electron beam in an electron beam apparatus, particularly with a multipole device formed according to any of embodiments 1 to 11, the electron beam apparatus comprising an aperture body having an aperture opening and a deposition pattern on two or more surface portions of the aperture body on two or more sides of the aperture opening, the deposition pattern being configured to act as a multipole in a charged state, the method comprising: directing the electron beam onto the aperture opening such that an outer portion of the electron beam is blocked by the aperture body and charges up the deposition pattern, and an inner portion of the electron beam propagates through the aperture opening and is influenced by the charged-up deposition pattern acting as a multipole.

Embodiment 16: The method of any of embodiments 12 to 15, wherein the deposition pattern is a carbon or carbonaceous pattern, particularly deposited in an electron beam-induced deposition process.

Embodiment 17: The method of any of embodiments 12 to 16, wherein the deposition pattern is an electron beam-induced deposition pattern.

Embodiment 18: The method of any of embodiments 12 to 17, wherein the deposition pattern acting as the multipole is not supplied with an external voltage or power and is only charged by the electron beam impinging thereon.

Embodiment 19: The method of any of embodiments 12 to 18, wherein the multipole comprises two or more distinct electrode portions configured to act as one of a quadrupole, a hexapole, an octupole, a higher-order multipole, and/or combinations thereof in a charged state.

Embodiment 20: The method of any of embodiments 12 to 19, wherein the electron beam is influenced such that beam aberrations of the electron beam are reduced or compensated.

Embodiment 21: Use of a multipole device formed by the method according to any of embodiments 1 to 11 for influencing an electron beam in an electron beam apparatus.

Embodiment 22: A multipole device for influencing an electron beam, wherein the multipole device is formed according to the method of any of embodiments 1 to 11.

Embodiment 23: A multipole device for influencing an electron beam, comprising: an aperture body having an aperture opening for the electron beam; and a deposition pattern, particularly an electron beam-induced deposition pattern formed on two or more surface portions of the aperture body on two or more sides of the aperture opening, the deposition pattern configured to act as a multipole that is chargeable by an outer portion of the electron beam for influencing an inner portion of the electron beam propagating through the aperture opening in a predetermined manner.

Embodiment 24: The multipole device of embodiment 22 or 23, wherein the deposition pattern is a carbonaceous or carbon pattern, particularly one formed in an electron beam-induced deposition process.

Embodiment 25: The multipole device of any of embodiments 22 to 24, wherein the multipole device does not include voltage or power supply connections connected to the deposition pattern, particularly wherein the plurality of electrodes of the multipole are not respectively connected to an external voltage or power supply.

Embodiment 26: The multipole device of any of embodiments 22 to 25, wherein the multipole is selected from the group consisting of a quadrupole, a hexapole, an octupole, a higher-order multipole, and combinations thereof.

Embodiment 27: An electron beam apparatus, comprising: an electron beam source (205) for generating an electron beam propagating along an optical axis (A), an objective lens (220) for focusing the electron beam on a sample (10), and a multipole device (100) as described herein, wherein the aperture opening of the multipole device is centered with respect to the optical axis (A). In some embodiments, the electron beam apparatus is an electron beam inspection apparatus for inspecting and/or imaging a sample, particularly an electron microscope, more particularly a scanning electron microscope.

While the foregoing is directed to embodiments, other and further embodiments may be devised without departing from the basic scope thereof, and the scope thereof is determined by the claims that follow.

The invention claimed is:

1. A method of forming a multipole device for influencing an electron beam, the method carried out in an electron beam apparatus that comprises an aperture body having at least one aperture opening, the method comprising:

deflecting the electron beam off an optical axis of the electron beam apparatus to impinge successively on two or more surface portions of the aperture body on two or more sides of the at least one aperture opening to generate an electron beam-induced deposition pattern configured to act as a multipole in a charged state.

2. The method of claim 1, wherein the electron beam-induced deposition pattern is a carbonaceous or carbon pattern derived from hydrocarbons present in the electron beam apparatus.

3. The method of claim 1, wherein the electron beam-induced deposition pattern is formed to comprise a plurality of electrode portions that are distributed in a circumferential direction around the at least one aperture opening and that provide a multipole having a predetermined azimuthal orientation.

4. The method of claim 1, wherein the electron beam-induced deposition pattern is generated with an n-fold rotational symmetry with respect to the at least one aperture opening, particularly a 2-fold, 3-fold, 4-fold, 6-fold, 8-fold, or a higher order rotational symmetry, or combinations thereof.

5. The method of claim 1, wherein the electron beam-induced deposition pattern is configured to act as a quadrupole, a hexapole, an octupole, a higher-order multipole, or as combinations thereof in the charged state.

6. The method of claim 1, wherein the aperture body is arranged at a position between an electron beam source and an objective lens of the electron beam apparatus, and the at least one aperture opening is centered with respect to an optical axis of the electron beam apparatus.

7. The method of claim 1, wherein the electron beam is successively focused onto the two or more surface portions of the aperture body to form two or more electrode portions of the multipole.

8. The method of claim 1, further comprising:

at least partially removing the electron beam-induced deposition pattern from the aperture body in the electron beam apparatus; and directing the electron beam on the aperture body to generate a second beam-induced deposition pattern configured to act as a second multipole.

9. The method of claim 8, wherein at least partially removing the electron beam-induced deposition pattern comprises at least one of heating the aperture body to a temperature suitable for deposition pattern removal and introducing a cleaning gas for deposition pattern removal into the electron beam apparatus.

10. A method of forming a multipole device for influencing an electron beam, the method carried out in an electron beam apparatus that comprises an aperture body having at least one aperture opening, the method comprising:

determining a beam aberration of the electron beam in the electron beam apparatus, and directing the electron beam onto two or more surface portions of the aperture body on two or more sides of the at least one aperture opening to generate an electron beam-induced deposition pattern configured to act as a multipole in a charged state, wherein the electron beam-induced deposition pattern is generated in a geometry for at least partially compensating or reducing said beam aberration when the electron beam at least partially propagates through the at least one aperture opening.

11. A method of forming a multipole device for influencing an electron beam, the method carried out in an electron beam apparatus that comprises an aperture body having at least one aperture opening, the method comprising:

directing the electron beam onto two or more surface portions of the aperture body on two or more sides of the at least one aperture opening to generate an electron beam-induced deposition pattern configured to act as a multipole in a charged state, wherein the at least one aperture opening is configured to act as a beam-limiting opening for the electron beam and has a diameter of 100 μm or less.

12. A method of forming a multipole device for influencing an electron beam, the method carried out in an electron beam apparatus that comprises an aperture body having at least one aperture opening, the method comprising:

directing the electron beam onto two or more surface portions of the aperture body on two or more sides of the at least one aperture opening to generate an electron beam-induced deposition pattern configured to act as a multipole in a charged state, the method further comprising influencing the electron beam with the multipole device by:

directing the electron beam onto the at least one aperture opening such that an outer portion of the electron beam is blocked by the aperture body and charges up the deposition pattern, and an inner portion of the electron beam propagates through the at least one aperture opening and is influenced by the deposition pattern acting as the multipole in the charged state.

13. A multipole device for influencing an electron beam, wherein the multipole device is formed by the method of claim 1.

* * * * *